US012621996B2

(12) United States Patent
Jeong et al.

(10) Patent No.: US 12,621,996 B2
(45) Date of Patent: May 5, 2026

(54) SEMICONDUCTOR INTEGRATED CIRCUIT DEVICE AND METHOD OF MANUFACTURING THE SEMICONDUCTOR INTEGRATED CIRCUIT DEVICE

(71) Applicant: SK hynix Inc., Icheon-si (KR)

(72) Inventors: Ki Chang Jeong, Icheon-si (KR); Nam Kuk Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 949 days.

(21) Appl. No.: 17/737,770

(22) Filed: May 5, 2022

(65) Prior Publication Data

US 2023/0189527 A1 Jun. 15, 2023

(30) Foreign Application Priority Data

Dec. 15, 2021 (KR) ........................ 10-2021-0179435

(51) Int. Cl.
| | |
|---|---|
| *H10B 43/40* | (2023.01) |
| *H10B 41/27* | (2023.01) |
| *H10B 41/41* | (2023.01) |
| *H10B 43/27* | (2023.01) |

(52) U.S. Cl.
CPC ............. *H10B 43/40* (2023.02); *H10B 41/27* (2023.02); *H10B 41/41* (2023.02); *H10B 43/27* (2023.02)

(58) Field of Classification Search
None
See application file for complete search history.

(56) References Cited

U.S. PATENT DOCUMENTS

| | | | |
|---|---|---|---|
| 6,809,349 B2 | 10/2004 | Yamaguchi et al. | |
| 11,069,704 B2 | 7/2021 | Lai et al. | |
| 2015/0048294 A1 | 2/2015 | Park | |
| 2018/0061766 A1 | 3/2018 | Goktepeli | |
| 2021/0313343 A1 | 10/2021 | Jung | |
| 2022/0077182 A1* | 3/2022 | Lee ........................ H10B 43/40 | |
| 2023/0180480 A1* | 6/2023 | Chung ............... H01L 25/0657 257/324 | |

FOREIGN PATENT DOCUMENTS

| | | |
|---|---|---|
| CN | 113497055 A | 10/2021 |
| CN | 116261333 A | 6/2023 |
| KR | 1020170129447 A | 11/2017 |

* cited by examiner

*Primary Examiner* — Bradley Smith
(74) *Attorney, Agent, or Firm* — WILLIAM PARK AND ASSOCIATES LTD.

(57) ABSTRACT

The present disclosure relates to a semiconductor integrated circuit device and method of manufacturing the semiconductor integrated circuit device. A semiconductor integrated circuit device including a semiconductor substrate, a first transistor, an insulation interlayer and a second transistor. The first transistor formed on the semiconductor substrate. The first transistor includes a horizontal channel substantially parallel to a surface of the semiconductor substrate. The insulating interlayer formed on an upper surface of the semiconductor substrate. A contact hole formed through the insulating interlayer. The second transistor including a channel layer formed in the contact hole. Any one of a source and a drain of the second transistor are electrically connected to any one of electrodes of the first transistor.

20 Claims, 14 Drawing Sheets

3000

SEMICONDUCTOR INTEGRATED CIRCUIT DEVICE AND METHOD OF MANUFACTURING THE SEMICONDUCTOR INTEGRATED CIRCUIT DEVICE

CROSS-REFERENCES TO RELATED APPLICATION

The present application claims priority under 35 U.S.C. § 119(a) to Korean application number 10-2021-0179435, filed on Dec. 15, 2021, in the Korean Intellectual Property Office, which is incorporated herein by reference in its entirety.

BACKGROUND

1. Technical Field

Various embodiments generally relate to a semiconductor integrated circuit device and a method of manufacturing the semiconductor integrated circuit device, more particularly, to a semiconductor integrated circuit device relating to an integration degree, and a method of manufacturing the semiconductor integrated circuit device.

2. Related Art

A multi-stack technology whereby three-dimensional stacked memory cell arrays are stacked has been proposed in response to integration degrees of memory devices greatly increasing.

Further, in order to secure an area of the memory cell array, peripheral circuits may be arranged under the memory cell array, Thus, electrical connection paths between memory cells and the peripheral circuits may be changed from a horizontal structure to a vertical structure.

SUMMARY

According to an example of an embodiment, there may be provided a semiconductor integrated circuit device. The semiconductor integrated circuit device may include a semiconductor substrate, a first transistor, an insulation interlayer and a second transistor. The first transistor may be formed over the semiconductor to substrate. The first transistor may include a horizontal channel substantially parallel to a surface of the semiconductor substrate. The insulating interlayer may be formed over an upper surface of the semiconductor substrate. A contact hole may be formed through the insulating interlayer. The second transistor may include a channel is layer in the contact hole, Any one of a source and a drain of the second transistor may be electrically connected to any one of electrodes of the first transistor.

According to an example of an embodiment, there may be provided a semiconductor integrated circuit device. The semiconductor integrated circuit device may include a first deck, a second deck, an electric element and a vertical channel transistor. The first deck may include peripheral circuits integrated in a semiconductor substrate, and a first insulation layer configured to electrically isolate the periph- eral circuits from each other. The second deck may be positioned over the first deck. The second deck may include a plurality of memory cell arrays and a second insulation layer. Each of the memory cell arrays may include a plurality of memory cells controlled by the peripheral circuits. The second insulation layer may be configured to electrically isolate the memory cell arrays from each other. The electric element may be provided to the first deck. The electric element may correspond to a part of the peripheral circuit. The vertical channel transistor may be integrated in a contact hole passing through the first and second insulation layers to expose the electric element.

According to an example of an embodiment, there may be provided a method of manufacturing a semiconductor inte- grated circuit device. In a method of the manufacturing semiconductor integrated circuit device, an electric element may be formed on a semiconductor substrate. An insulating interlayer may be formed on the semiconductor substrate. The insulating interlayer may be etched to form a first contact hole configured to expose the electric element. A transistor including a vertical channel may be formed in the first contact hole.

In an example of an embodiment, forming the transistor with the vertical channel may include forming a vertical gate at a sidewall of the first contact hole, forming a gate insulation layer a surface of the vertical gate and the sidewall of the first contact hole, forming a vertical channel layer on a surface of the gate insulation layer and the electric element exposed through the first contact hole, and forming a junc- tion region on the vertical channel layer.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments will be described in greater detail with reference to the accompanying drawings. The drawings are schematic illustrations of various embodiments (and intermediate structures). As such, variations from the con- figurations and shapes of the illustrations as a result, for example, of manufacturing techniques and/or tolerances, are to be expected, Thus, the described embodiments should not be construed as being limited to the particular configurations and shapes illustrated herein but may include deviations in configurations and shapes which do not depart from the spirit and scope of the present disclosure as defined in the appended claims.

The embodiments are described herein with reference to cross-section and/or plan illustrations of embodiments of the present disclosure. However, embodiments should not be construed as limiting the concepts provided herein. Although a few embodiments will be shown and described, it will be appreciated by those of ordinary skill in the art that changes may be made in these embodiments without departing from the principles and spirit of the present disclosure. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals of time at least partially overlap each other such that there exists a time at which the first and second occurrences are both taking place.

Figure 1:
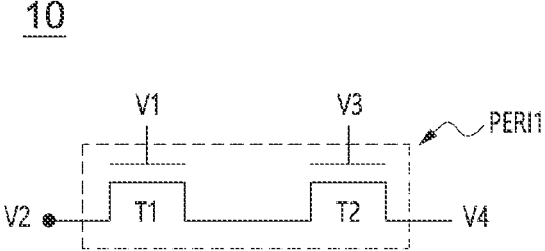
FIG. 1 is a circuit diagram illustrating a semiconductor integrated circuit device in accordance with examples of embodiments.
Figure 2:
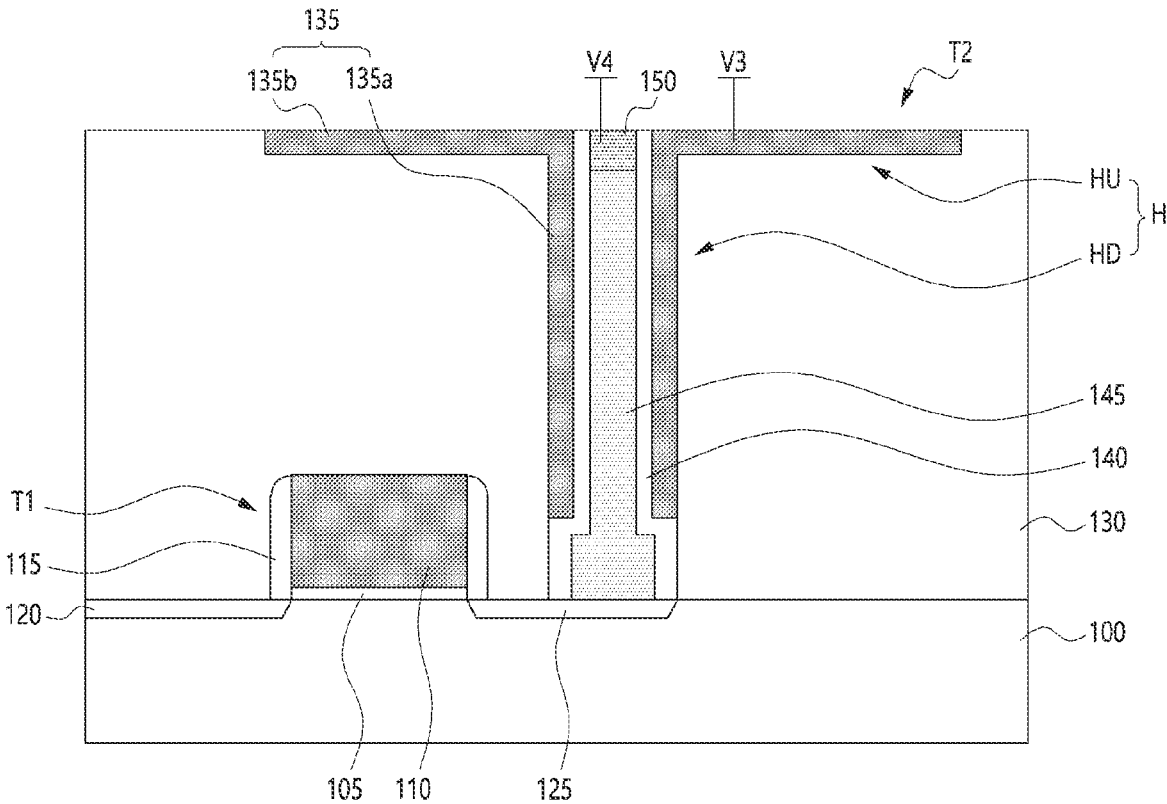
FIG. 2 is a cross-sectional view taken illustrating the semiconductor integrated circuit device in FIG. 1.

FIG. 1 is a circuit diagram illustrating a semiconductor integrated circuit device in accordance with various embodiments and FIG. 2 is a cross-sectional view illustrating the semiconductor integrated circuit device in FIG. 1.

Referring to FIG. 1, a semiconductor integrated circuit device 10 may include a peripheral circuit PERI1. The peripheral circuit PERI1 may generate a digital signal, an analog signal and/or a combination signal for readily operating a memory device. For example, the peripheral circuit PERI1 may include a page buffer, a decoder such as a row decoder and a column decoder, a sense amplifier, a driver, a charge pump, a current reference or a voltage reference, an active element or a passive element, etc. The passive element may include a resistor, an inductor and a capacitor. In some embodiments, the active element and the passive element or electrodes of the active element such as a gate, a source, a drain an anode and a cathode may be interpreted as an electric element.

In some embodiments, the peripheral circuit PERU may include a first transistor T1 and a second transistor T2. The first transistor T1 and the second transistor T2 may be electrically connected with each other. The first transistor T1 and the second transistor T2 may commonly share a source. For example, the first transistor T1 and the second transistor T2 may include an NMOS to transistor.

In some embodiments, the first transistor T1 may have a planar structure including a horizontal channel. The second transistor T2 may have a vertical structure including a vertical channel.

In some embodiments, V1 may indicate a first gate voltage or a first gate voltage terminal of the first transistor T1. V2 may indicate a first drain voltage or a first drain voltage terminal of the first transistor T1. V3 may indicate a second gate voltage or a second gate voltage terminal of the second transistor T2. V4 may indicate a second drain voltage or a second drain voltage terminal of the second transistor T2.

In some embodiments, a terminology of "horizontal" may represent a direction substantially parallel to an upper surface of a semiconductor substrate 100. A terminology of "vertical" may represent may a direction substantially perpendicular to the upper surface of the semiconductor substrate 100.

Referring to FIG. 2, the semiconductor substrate 100 may be prepared. The semiconductor substrate 100 may include a single crystalline semiconductor layer. For example, the semiconductor substrate 100 may include a bulk silicon substrate, a silicon-on-insulator (SOI) substrate, a germanium substrate, a germanium-on-insulator (GOI) substrate, a silicon-germanium substrate, an epitaxial layer growing by a selective epitaxial growth, etc. The semiconductor substrate 100 may include at least one well region having various concentrations and shapes in accordance with characteristics of devices to be formed on the semiconductor substrate 100.

The first transistor T1 may be formed on the semiconductor substrate 100. For example, the first transistor T1 may be an element in a peripheral circuit. The first transistor T1 may include a gate structure, a first drain 120 and a common source 125. The gate structure may include a first gate insulation layer 105, a first gate 110 and an insulating spacer 115. The first gate insulation layer 105 may be formed over the semiconductor substrate 100. The first gate 110 may be formed over the first gate insulation layer 105. The insulating spacer 115 may be formed over a sidewall of the first gate 110. The first drain 120 may be formed by implanting conductive impurities into one side of the gate structure. The common source 125 may be formed by implanting conductive impurities into the other side of the gate structure. Thus, the first drain 120 and the common source 125 may be junction regions. For example, the first drain 120 and the common source 125 of the first transistor T1 may be substantially coplanar with each other. Thus, when a voltage is applied to the first gate 110, the horizontal channel parallel to the upper surface of the semiconductor substrate 100 may be generated between the first drain 120 and the common source 125. In an embodiment, the first transistor may be integrated in the semiconductor substrate 100 as illustrated in FIG. 2.

An insulating interlayer 130 may be formed over the semiconductor substrate 100 with the first transistor T1. For example, the insulating interlayer 130 may include multi-layered insulating layers. Although not depicted in drawings, a plurality of multi-wiring structures and at least one memory cell array may be formed in the insulating interlayer 130.

A contact hole H may be formed through the insulating interlayer 130 to expose the common source 120. For example, the contact hole H may include a lower hole HD and an upper hole HU extending from an upper surface of the lower hole HD. The lower hole HD may have a diameter narrower than a diameter of the upper hole HU. Further, the lower hole HD may have a depth deeper than a depth of the upper hole HU.

Figure 3:
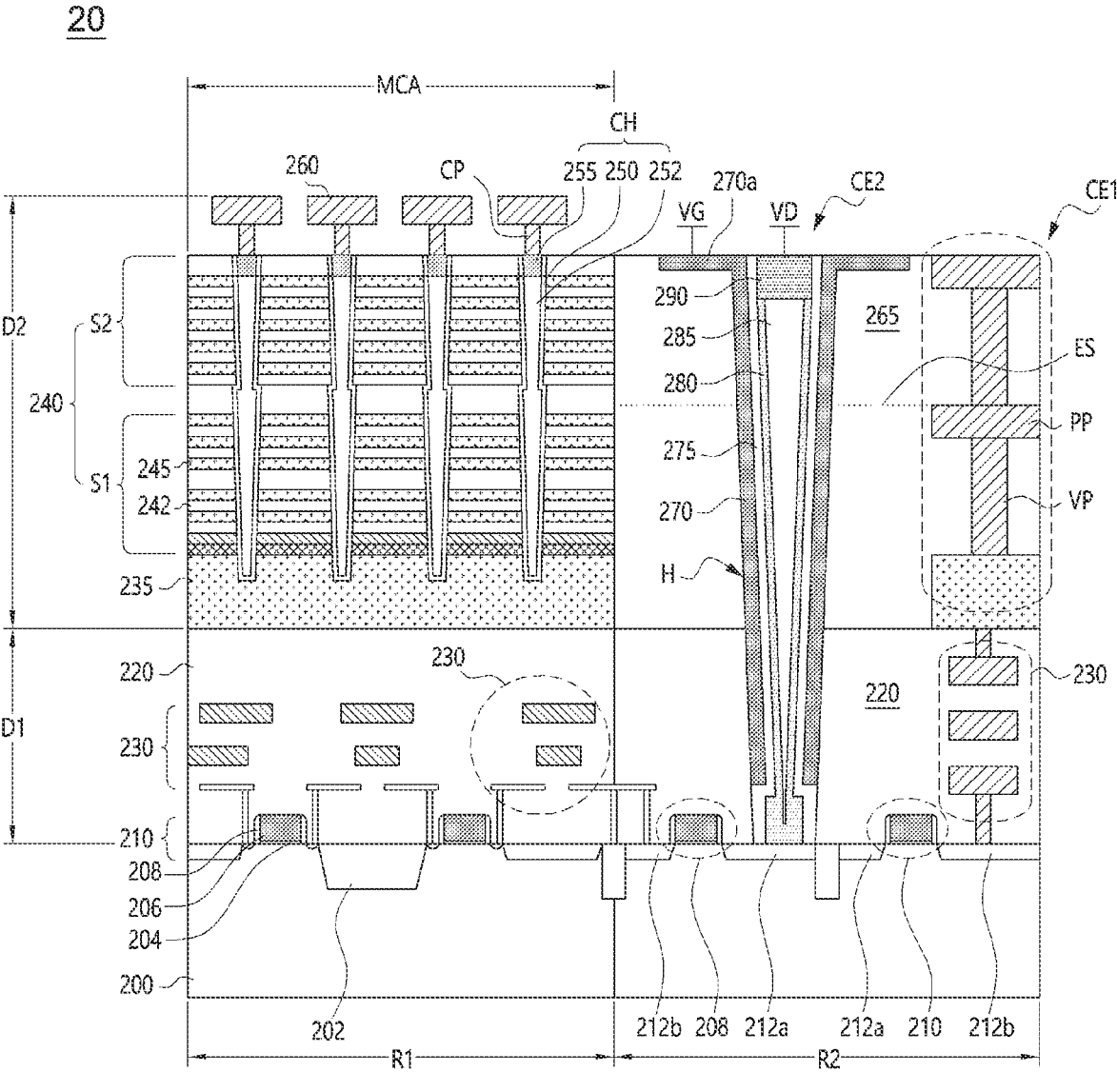
FIG. 3 is a cross-section& view illustrating a semicon- ductor integrated circuit device in accordance with examples of embodiments.

The second transistor T2 may be formed in the contact hole H. The second transistor T2 may include a second gate 135, a second gate insulation layer 140, a channel layer 145 and a second drain 150. In an embodiment the second transistor T2 may be integrated in the contact hole H as illustrated in FIG. 3.

The second gate 135 may include a vertical gate 135a and a gate pad 135b. The vertical gate 135a may be extended along an inner wall of the lower hole HD. The gate pad 135b may be extended from the vertical gate 135a to fill up the upper hole HU. The second gate insulation layer 140 may be formed along a surface of the vertical gate 135a and the exposed inner wall of the lower hole HD. The channel layer 145 having a uniform thickness may be formed on a surface of the second insulation layer 140 and a bottom surface of the contact hole H. For example, the channel layer 145 may include a semiconductor material such as silicon, polysilicon, GaAs, etc. The channel layer 145 may include conductive impurities having a conductive type opposite to the conductive type of the common source 125. In some embodiments, the contact hole H may be fully filled with the channel layer 145. Alternatively, the channel layer 145 may have a liner shape extended along the surface of the second gate insulation layer 140. A transistor having the liner-shaped channel layer 145 may be illustrated later.

In some embodiments, the channel layer 145 may include a semiconductor layer configured to selectively generate a mobility path in accordance with an external stimulus such as a gate voltage. Although the channel layer 145 may further include a vertical channel layer 280 and 370 illustrated later, the channel layer 145 may be interpreted as following cases that the mobility path may be formed or not formed.

The channel layer 145 may make contact with the common source 125 exposed through the bottom surface of the contact hole H. Thus, the common source 125 and a part of the channel layer 145, which may make contact with the common source 125, may be operated as a second source of the second transistor T2. The second drain 150 may be formed in an upper region of the contact hole H. The second drain 150 may be formed by implanting impurities having a high concentration into the upper region of the channel layer 145. Alternatively, a space may be formed in the upper to region of the contact hole H. The space may be filled with a semiconductor layer including impurities having a high concentration to form the second drain 150 making contact with the channel layer 145.

The second drain 150 of the second transistor T2 may face the common source 125 and the part of the channel layer 145 making contact with the common source 125 in a space defined by the contact hole H. When the gate voltage V2 may be applied to the second gate 130, the mobility path may be generated in the channel layer 145 between the second drain 150 and the common source 125. Because the channel layer 145 may be extended in a lengthwise direction of the contact hole H, i.e., a direction substantially perpendicular to the upper surface of the semiconductor substrate 100, the second transistor T2 may have the vertical channel.

Although not depicted in drawings, the insulating interlayer 130 may include a peripheral circuit and a memory cell array. The peripheral circuit may include the first transistor T1. Particularly, when the memory cell array may include a stack type memory string structure or a stack type memory cell array structure of a 3D NAND flash memory device, the insulating interlayer 130 may have a thickness of thousands Å to ten thousands Å. Thus, the contact hole H having a high aspect ratio (HAR) may be formed in the insulating interlayer 130. In an embodiment, the contact hole H having the HAR may be used as a device formation region such as the transistor to increase an integration density. Further, in an embodiment, the active element in place of a wiring such as a plug may be integrated in the space defined by the contact hole H to decrease a length of a wiring.

FIG. 3 is a cross-sectional view illustrating a semiconductor integrated circuit device in accordance with various embodiments.

Referring to FIG. 3, a semiconductor integrated circuit device 20 may include a first deck D1 and a second deck D2 sequentially stacked on a semiconductor substrate 200.

The first deck D1 may include a multi structure including peripheral circuits. The second deck D2 may include a multi structure including a memory cell array. Further, the semiconductor integrated circuit device 20 may include a first region R1 and a second region R2. For example, the first region R1 may include a memory cell array region. The second region R2 may include elements configured to connect external terminals of the memory cell array or the peripheral circuits and the external terminals with each other. For example, the semiconductor integrated circuit device 20 may include a three-dimensional non-volatile memory device. Alternatively, the semiconductor integrated circuit device 20 may include a three-dimensional memory device including the memory cell array on the peripheral circuits.

The semiconductor substrate 200 may include the above-mentioned semiconductor materials. An isolation layer 202 may be formed in the semiconductor substrate 200. The isolation layer 202 may be formed between the first region R1 and the second region R2. Further, the isolation layer 202 may be configured to define regions in which elements of the peripheral circuit PERI1 may be formed.

The first deck D1 may include a plurality of transistors 210, a lower insulating interlayer 220 and a lower wiring connection 230.

The transistors 210 may form the peripheral circuit. Each of the transistors 210 may include a gate 206, a source 212a and a drain 212b. The gate 206 may be positioned on the semiconductor substrate 200. A gate insulation layer 204 may be formed between the semiconductor substrate 200 and the gate 206. The source 212a and the drain 212b may be junction regions formed in the semiconductor substrate 200 at both sides of the gate 206. The source 212a and the drain 212b may be commonly shared by an adjacent transistor. A reference numeral 208 may indicate a gate sidewall spacer.

The lower insulating interlayer 220 may be configured to electrically isolate the transistors 210 from each other. The lower insulating interlayer 220 may be formed on the semiconductor substrate 200 with the transistors 210.

The lower wiring connection 230 may be formed in the lower insulating interlayer 220. The lower wiring connection 230 may include wiring lines configured to transmit electrical signals to the gate 206, the source 212a and the drain 212b of the transistors 210.

The second deck D2 may be stacked on the first deck D1. The second deck D2 may include a memory cell array MCA, a plurality of connections CE1 and CE2 and an upper insulating interlayer 265. For example, the memory cell array MCA may be formed in the first region R1. The connections CE1 and CE2 may be formed in the second region R2. The upper insulating interlayer 264 may be formed between the memory cell arrays MCA, between the memory cell array MCA and the connections CE1 and CE2 and between the connections CE1 and CE2.

The memory cell array MCA may include a plate 235, a plurality of memory cells 240 and a plurality of bit lines 260.

The plate 235 may be formed on the first deck D1. The plate 235 may include a conductive layer, for example, a polysilicon layer including conductive impurities. At least part of the plate 235 may be used for a common source of the 3D NAND flash memory device. For example, the plate 235 may include a multi-layered polysilicon structure.

Each of the memory cells 240 may include stack structures S1 and S2 including an insulation layer 242 and a cell gate 245 alternately stacked. For example, each of the stack structures S1 and S2 may include gates of a string in the 3D NAND flash memory device. In order to improve the integration density of the memory cells 240, the stack structures S1 and S2 may be stacked many times to form the memory cell array MCA having a multi stack structure.

Further, the memory cell array MCA may include cross point array type memory cells. The memory cell array MCA may include stacked cross point arrays.

In some embodiments, the insulation layer 242 between the cell gates 245 may include silicon oxide or metal oxide. The cell gate 245 may include at least one of a conductive material, for example, doped polysilicon, metal nitride, metal-semiconductor compound such as TiSi, NiSi, etc., and a metal such as W. The insulation layer 242 may have a uniform thickness or different thicknesses in accordance with a design, Stacked numbers of the insulation layer 242 and the cell gate 245 may be changed in accordance with the integration density.

The memory cells 240, i.e., the stack structures S1 and S2 may include a plurality of channel structures CH. The channel structure CH may be formed through the stack structures S1 and S2. In some embodiments, the channel structure CH may be extended vertically from a surface of the semiconductor substrate 200.

The channel structure CH may be formed in a channel contact hole formed in the stack structures S1 and S2. The channel contact hole may be configured to partially expose the plate 235. The channel structure CH may include a channel layer 250, a gap-filling insulation layer 252 and a capping layer 255. The channel layer 250 may be formed on an inner wall of the channel contact hole. The channel layer 250 may include a tunnel insulation layer, a data storage layer and a blocking insulation layer sequentially stacked. The gap-filling layer 252 may be formed in the channel contact hole. The capping layer 255 may be formed in an upper region of the channel contact hole. The capping layer 255 may be formed on the channel layer 250 and the gap-filling layer 252. The capping layer 255 may include a conductive layer, for example, a polysilicon layer including conductive impurities. The conductive type of the capping layer 255 may be substantially the same as the conductive type of the plate 235. For example, the capping layer 255 may correspond to a drain region of a drain selection transistor in the 3D NAND string.

The bit lines 260 may be electrically connected with the capping layer 255. For example, each of the bit lines 260 may be electrically connected to the capping layers 255 positioned on a same column. The bit lines 260 and the capping layer 255 may be electrically connected with each other via a contact plug CP. When the stack structures S1 and S2 may be stacked many times, the capping layer 255 and the bit lines 260 may be formed on an uppermost stack structure S2.

The memory cell structure of the 3D NAND flash memory device may be disclosed in U.S. Patent Publication No, 2021/0313343, the contents of which are herein incorporated by reference in their entirety.

The second deck D2 may include the first connection CE1 and the second connection CE2 in the second region R2. The first connection CE1 and the second connection CE2 may be extended to the first deck D1 as well as the second deck D2.

The first connection CE1 may include a passive element connected to the lower wiring connection 230, which may be electrically connected to at least one of the gate 208, the source 212b and the drain 212a of the transistor 210 in the second region R2. For example, the first connection CE1 may include a multi wiring structure electrically connected to the lower wiring connection 230 and a power terminal. The multi wiring structure may be used as a resistor, a capacitor or an inductor. The first connection CE1 may include a plurality of vertical patterns VP and a plurality of horizontal patterns PP alternately stacked. Each of the vertical patterns VP may be electrically connected between a lower horizontal pattern PP and an upper horizontal pattern PP on different levels. Each of the horizontal patterns PP may be electrically connected between a lower vertical pattern VP and an upper vertical pattern VP on different levels.

The second connection CE2 may include an active element electrically connected to at least one of the gate 260, the source 212a and the drain 212b of the transistor 210 in the second region R2, In some embodiments, the second connection CE2 may include a vertical channel transistor directly or indirectly connected to the gate 206, the source 212a and the drain 212b of the transistor 210.

For example, the second connection CE2 may be formed in the contact hole H formed through the second deck D2 and the first deck D1. Alternatively, the second connection CE2 may be formed in the contact hole H formed through the upper insulating interlayer 265 of the second deck D2 and the lower insulating interlayer 220 of the first deck D1. The second connection CE2 may include a vertical channel transistor in the contact hole H. The vertical channel transistor may include a vertical gate 270, a gate insulation layer 275, a vertical channel layer 280, a gap-filling layer 285 and a drain 290.

The vertical gate 270 may be formed on the sidewall of the contact hole H. The vertical gate 270 may be spaced apart from the bottom surface of the contact hole H. The vertical gate 270 may be extended from an outer surface of the contact hole H to be used as a gate pad 270a. The gate pad 270a may electrically make contact with a gate terminal VG.

The gate insulation layer 275 may be formed on surfaces of the vertical gate 270 and the contact hole H.

The vertical channel layer 280 may be formed on an inner surface of the gate insulation layer 275. The vertical channel layer 280 may be electrically connected to the source 212a. Thus, the vertical channel transistor may commonly share the source 212a with the transistor 210 having the horizontal channel.

The gap-filling layer 285 may be formed in a space surrounded by the vertical channel layer 280.

The drain 290 may be formed on the vertical channel layer 280 and the gap-filling layer 285. In order to position the drain 290 in the contact hole H, the vertical channel layer 280 and the gap-filling layer 285 may be recessed to provide the vertical channel layer 280 and the gap-filling layer 285 with a height lower than a height of the contact hole H.

The drain 290 may be electrically connected with a power line VD. Although not depicted in drawings, the source 212a may receive a substrate bias using an in-body contact manner or a well contact manner.

A reference numeral ES may indicate an etch stopper.

According to some embodiments, the active element such as the transistor may be integrated in the contact hole formed through the second deck D2 including the memory cell array and the first deck D1 including the peripheral circuit to improve the density of the integrated circuit. That is, in some embodiments, the transistor may be integrated in the contact hole having the HAR to improve the integration density by an area of the transistor. Further, in some embodiments, the contact hole having the HAR may have the height of no less than a height of at least one stack structure S so that the transistor having the long channel may be integrated in the contact hole H. As a result, in some embodiments, the transistor having the long channel may be used as the peripheral circuit regardless of the area of the transistor to improve operational characteristics of the semiconductor memory device.

In some embodiments, the second deck D2 may be stacked on the first deck D1. Alternatively, the first deck D1 may be formed in a first semiconductor chip. The second deck D2 may be formed in a second semiconductor chip. The first deck D1 and the second deck D2 may then be hybrid-bonded to each other.

Figure 4:
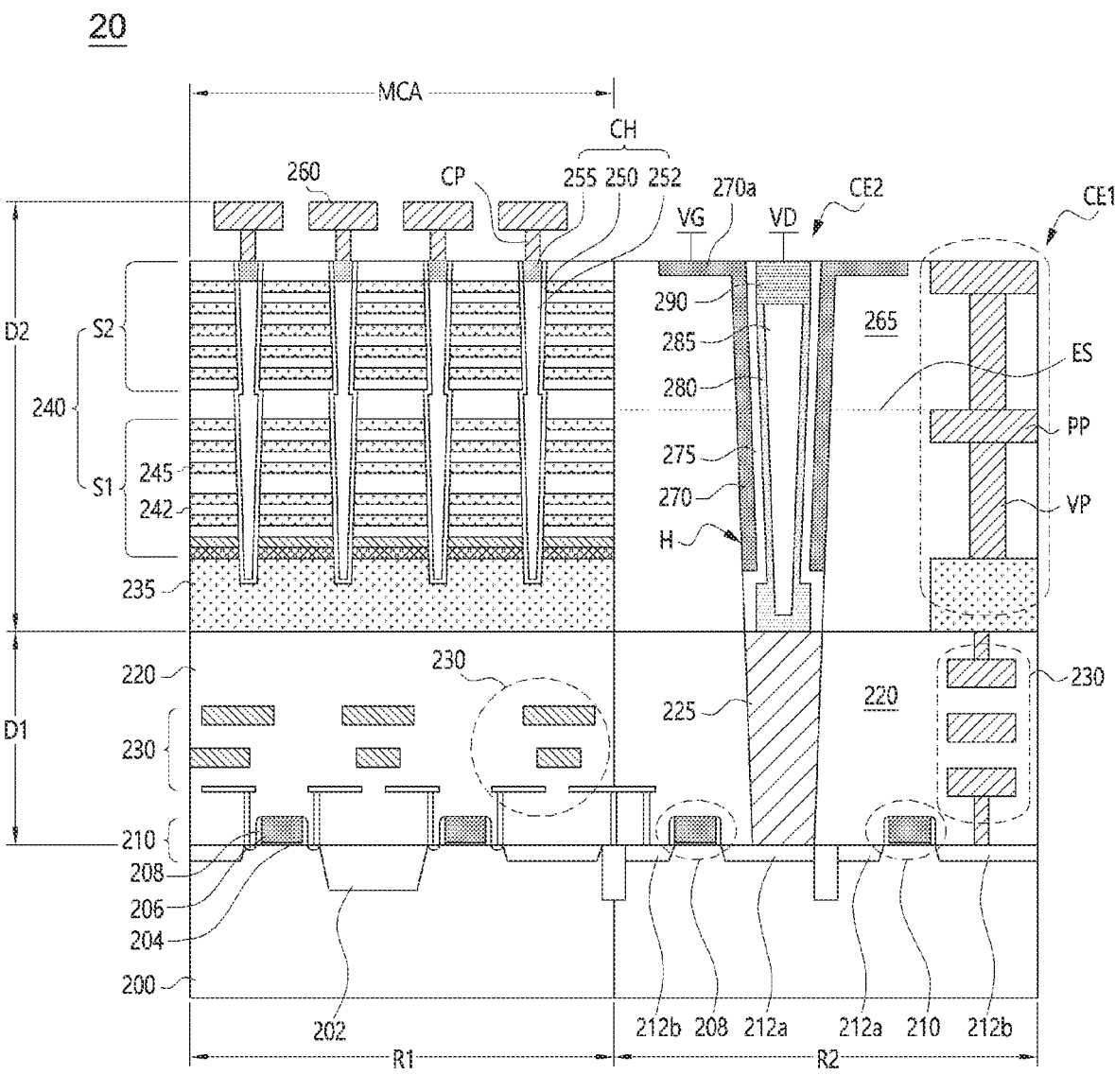
FIG. 4 is a cross-sectional view illustrating a semicon- ductor integrated circuit device in accordance with examples of embodiments.

FIG. 4 is a cross-sectional view illustrating a semiconductor integrated circuit device in accordance with some embodiments.

Referring to FIG. 4, the second connection CE2 of the semiconductor integrated circuit device 20 may further include a conductive plug 225 for controlling a channel length.

The conductive plug 225 may be inserted into the vertical channel layer 280 facing the source 212a and the drain 290. For example, the conductive plug 225 may include a polysilicon layer including conductive impurities. The conductive plug 225 may be positioned in a lower region of the contact hole H to control the channel length of the second connection CE2, i.e., the vertical channel transistor. The channel length of the transistor may be controlled in accordance with a height of the conductive plug 225. Thus, in an embodiment, a performance of the transistor may be controlled in accordance with characteristics of the peripheral circuits. In an embodiment, the conductive plug 225 may be interposed between at least one electrode of the first transistor T1 and a source or a drain of the second transistor T2 as illustrated in FIG. 4.

FIGS. 5 to 9 are cross-sectional views illustrating a method of manufacturing a semiconductor integrated circuit device in accordance with various embodiments. In some embodiments, a method of manufacturing first and second connections CE1 and CE2 in a second region R2 may be illustrated. A reference numeral R21 may indicate a region where the first connection CE1 may be formed and a reference numeral R22 may indicate a region where the second connection CE2 may be formed.

Figure 5:
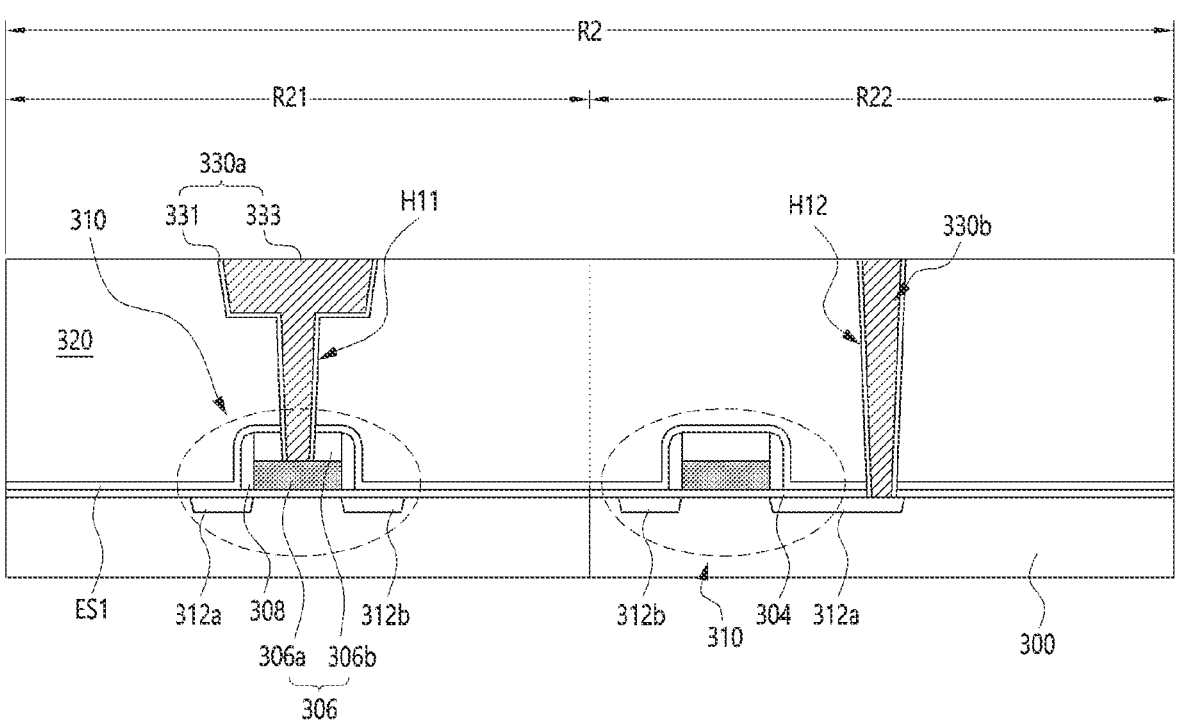
FIGS. 5 to 9 are cross-sectional views illustrating a method of manufacturing a semiconductor integrated circuit device in accordance with examples of embodiments.

Referring to FIG. 5, a gate insulation layer 304 and a gate layer may be sequentially formed on a semiconductor substrate 300. The semiconductor substrate 300 may include conductive impurities. For example, the semiconductor substrate 300 may include a conductive well (not shown). The conductive well may be formed by an ion implantation process and an activation process. The gate layer may include at least one conductive layer. For example, the gate layer may include a polysilicon layer with conductive impurities, a transition metal silicide layer, a metal layer, etc. Alternatively, the gate layer may include a stack layer including at least two of a polysilicon layer with conductive impurities, a transition metal silicide layer, a metal layer, etc. In some embodiments, the gate layer may include at least one conductive layer 306a and a hard mask layer 306b.

The gate layer may be patterned to form a gate 306 of a transistor in a peripheral circuit. An insulating spacer 308 may be formed on a sideman of the gate 306. Hereinafter, a gate structure may include a gate insulation layer 304, the gate 306 and the spacer 308.

Conductive impurities may be implanted into the semiconductor substrate 300 at both sides of the gate structure to form a source 312a and a drain 312b, thereby defining transistors 310 of the peripheral circuit.

A first etch stopper ES1 may be formed on the transistors 310. For example, the first etch stopper ES1 may include a silicon nitride layer. In some embodiments, the first etch stopper ES1 may protect the transistor 310 in an etching process for forming a contact hole.

A first insulating interlayer 320 may be formed on the first etch stopper ES1. The first insulating interlayer 320 may include at least one insulation layer. Further, the first insulating interlayer 320 may include an insulation layer having a low dielectric constant.

The first insulating interlayer 320 may be etched to form first contact holes H11 and H12 configured to expose the gate 306, the source 312a and/or the drain 312b of the transistor 310. For example, the first contact hole H11 in the first connection region R21 may be configured to expose the gate 306. The first contact hole H12 in the second connection region R22 may be configured to expose the source 312a, not limited thereto. For example, the first contact holes H11 and H12 may be configured to expose all or at least one of the gate 306, the source 312a and the drain 312b of the transistor 310.

In some embodiments, the first contact hole H11 in the first connection region R21 and the first contact hole H12 in the second connection region R22 may be formed by a same etching process. Alternatively, the first contact hole H11 in the first connection region R21 and the first contact hole H12 in the second connection region R22 may be formed by different etching processes. First and second etching processes using masks having different sizes may be performed on the first connection region R21 to form the first contact hole H11 having an upper width and a lower width different from the upper width. Any one of the first and second etching processes may be performed on the second connection region R22 to form the first contact hole H12 having a uniform width. Although the first contact hole H12 may have gradually decreased diameters along a downward direction in drawings, the diameters of the first contact hole H12 may be caused by a deficient supply of an etching gas due to a thickness of the insulating interlayer 320. That is, the first contact hole H12 may be formed using one mask to have the uniform width.

The first contact holes H11 and H12 may be filled with a conductive material to form first wiring connections 330a and 330b, For example, the first wiring connections 330a and 330b may include a conductive barrier layer 331 and a conductive buried layer 333. The conductive barrier layer 331 may include a Ti/TiN layer. The conductive buried layer 333 may include a tungsten layer having good gap-filling characteristic. However, the conductive barrier layer 331 and the conductive buried layer 333 may include other various conductive layers.

In some embodiments, the first wiring connection 330a of the first connection region R21 may include a contact plug having a relatively narrow width and a contact pad having a relatively wide width, not limited thereto. For example, the first wiring connection 330a may have the multi wiring structure in FIGS. 3 and 4. When the first wiring structure 330a may have the multi wiring structure, the first wiring structure 330a in the first connection region R12 and the first wiring structure 330b in the second connection region R22 may be formed by different processes. The first wiring structure 330b may be a sacrificial pattern. Further, the first wiring structure 330b may be removed when a contact hole with a target height is formed in the second connection region R22.

Figure 6:
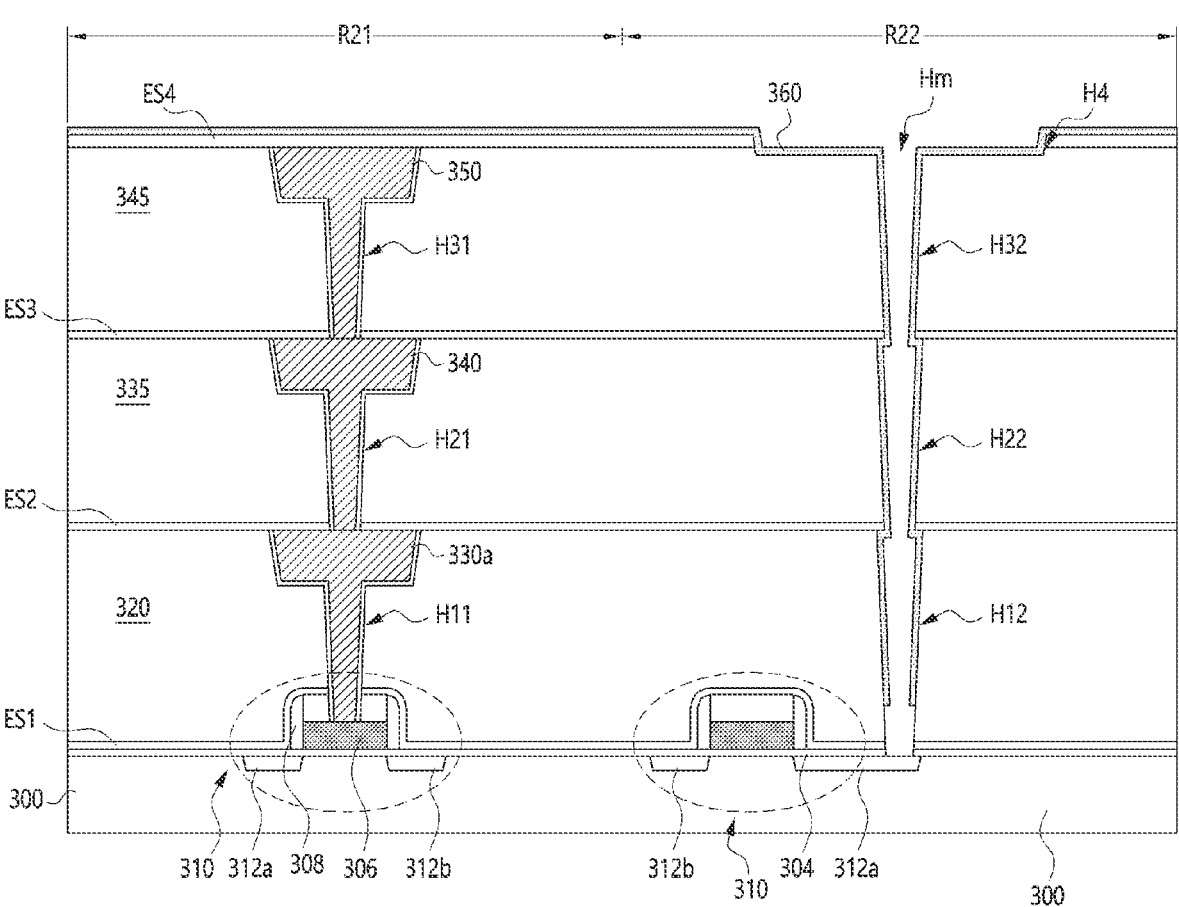

Referring to FIG. 6, a second etch stopper ES2 may be formed on the first insulating interlayer 320. Although not depicted in drawings, a first stack structure S1 in FIG. 3 including the memory cells may be formed on the second etch stopper ES2 corresponding to the first region R1 in FIG. 3.

A second insulating interlayer 335 may be formed on the second etch stopper ES2. The second insulating interlayer 335 may be configured to electrically isolate the first stack structures S1 from each other. The second insulating interlayer 335 may have a height substantially equal to or greater than the height of the first stack structure S1. The second insulating interlayer 335 may include multi insulation layers.

The second insulating interlayer 335 may be etched to form second contact holes H21 and H22. The second contact hole H21 in the first connection region R21 may be configured to expose an upper surface of the first wiring connection 330a. The second contact hole H22 in the second connection region R22 may be configured to expose an upper surface of the second wiring connection 330b. The second insulating interlayer 335 may include multi insulation layers. Further, the second contact holes H21 and H22 in the first and second connection regions R21 and R22 may have different shapes by at least one etching process. Because the second insulating interlayer 335 may receive the first stack structure S1, the second insulating interlayer 335 may have a height of no less than the height of the first stack structure S1. Thus, the second contact holes H21 and H22 may also have a height higher than the height of the first stack structure S1. The second contact holes H21 and H22 may be filled with a conductive layer to form a second wiring connection 340. The second wiring connection 340 may include a conductive barrier layer and a conductive buried layer similarly to the first wiring connection 330a.

A third etch stopper ES3 may be formed on the second insulating interlayer 335. Although not depicted in drawings, a second stack structure S2 in FIG. 3 including the memory cells may be formed on the third etch stopper ES3 corresponding to the first region R1 in FIG. 3. Thus, the first stack structure S1 and the second stack structure S2 may be stacked on the first region R1 to form the memory cell array having a multi stack structure. A third insulating interlayer 345 may be formed on the third etch stopper ES3. The third insulating interlayer 345 may be configured to electrically isolate the second stack structures S2 from each other.

The third insulating interlayer 345 may be etched to form third contact holes H31 and H32. The third contact hole H31 in the first connection region R21 may be configured to expose an upper surface of the second wiring connection 340. The third contact hole H32 in the second connection region R22 may be configured to expose the upper surface of the second wiring connection in the second connection region R22. The third contact holes H31 and H32 may be filled with a conductive material to form a third wiring connection 350. For example, the third wiring connections 350 may have a structure substantially the same as the structures of the first and second wiring connections 330 and 340.

A fourth etch stopper ES4 may be formed on the third insulating interlayer 345. The fourth etch stopper ES4 and the third insulating interlayer 345 may be etched to form a fourth contact hole H4 configured to expose the third wiring connection 350 in the second connection region R22 and a peripheral region around the third wiring connection 350, For example, the fourth contact hole H4 may have a width wider than the width of the third contact hole H32. A contact pad or a landing pad may be formed in the fourth contact hole H4, Thus, the width, an area and a thickness of the fourth contact hole H4 may be determined in accordance with an area, a resistance, etc., of the contact pad.

The third wiring connection of the second connection region R22 may be exposed through the fourth contact hole H4. The exposed third wiring connection, the second wiring connection under the third wiring connection and the first wiring connection under the second wiring connection may be selectively removed. Therefore, the first to fourth contact holes H1, H2, H3 and H4 in the second connection region R22 may be connected with each other to form a multi-level contact hole Hm.

A vertical gate layer 360 may be formed on the fourth etch stopper E54 and the exposed multi-level contact hole Hm. The vertical gate layer 360 may include a conductive layer. For example, the vertical gate layer 360 may include a polysilicon layer doped with conductive impurities. The vertical gate layer 360 may have a liner shape extended along a side surface and a bottom surface of the multi-level contact hole Hm. For example, the vertical gate layer 360 may be formed by an atomic layer deposition (ALD) process, a plasma-enhanced ALD (PEALD) process, etc.

The vertical gate layer 360 on the bottom surface and the side surface of the multi-level contact hole Hm may be etched. Thus, the vertical gate layer 360 may be electrically isolated from the source 312a or the drain 312b, For example, the vertical gate layer 360 may be selectively etched using a sacrificial layer.

Figure 7:
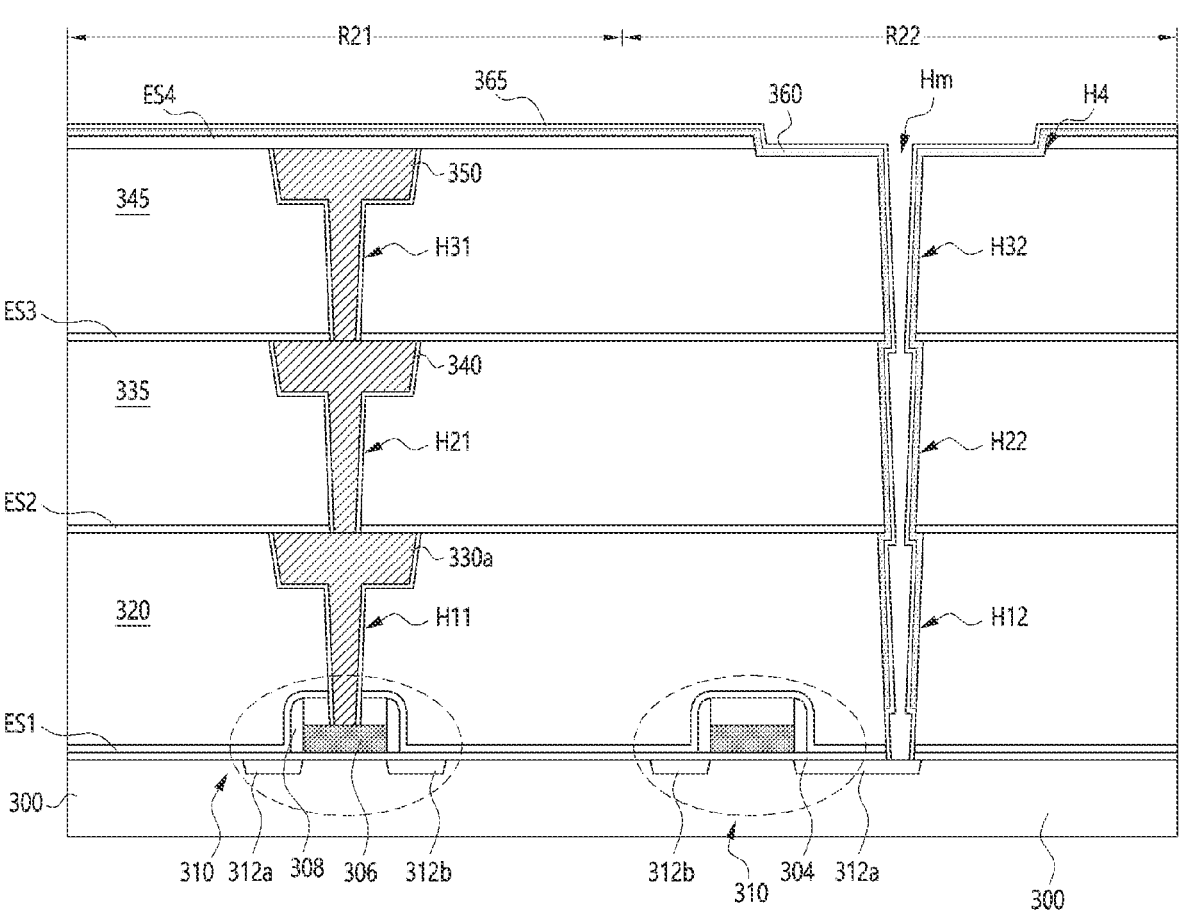

Referring to FIG. 7, a gate insulation layer 365 may be formed on surfaces of the vertical gate layer 360 and the multi-level contact hole Hm. The gate insulating layer 365 may be formed by an atomic layer deposition (ALD) process, a plasma enhanced atomic layer deposition (PEALD) process, etc. The gate insulating layer 365 may be etched to expose the source 312a.

Figure 8:
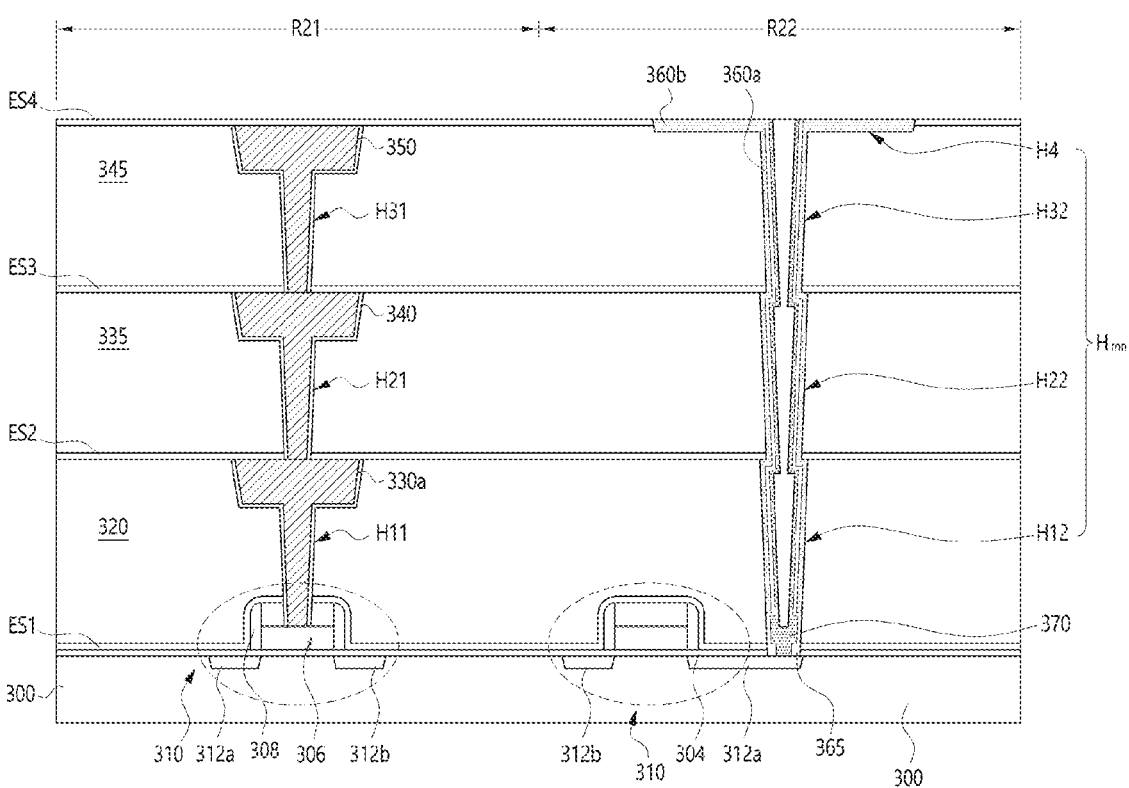

Referring to FIG. 8, a vertical channel layer 370 may be formed on surfaces of the gate insulating layer 365 and the multi-to level contact hole Hm. The vertical channel layer 370 may make contact with the exposed source 312a, The vertical channel layer 370 may be electrically isolated from the vertical gate layer 360 by the gate insulation layer 365. The vertical channel layer 370 may include a polysilicon layer doped with conductive impurities, not limited thereto. For example, the vertical channel layer 370 may include a semiconductor layer capable of forming a channel.

In some embodiments, the vertical gate layer 360, the gate insulating layer 365 and the vertical channel layer 370 may have a liner shape to not fully fill the multi-level contact hole Hm.

The vertical gate layer 360, the gate insulation layer 365 and the vertical channel layer 370 may be planarized to expose the surfaces of the vertical gate layer 360 and the fourth etch stopper ES4, thereby defining a vertical gate 360a and a gate pad 360b. The vertical gate 360a may be formed on the side surfaces of the first to third contact holes H12, H22 and H32. The gate pad 360b may be extended from the vertical gate 360a to fill the fourth contact hole H4. The gate layer 360, the gate insulation layer 365 and the vertical channel layer 370 may remain only in the multi-level contact hole Hm by the planarization process.

Figure 9:
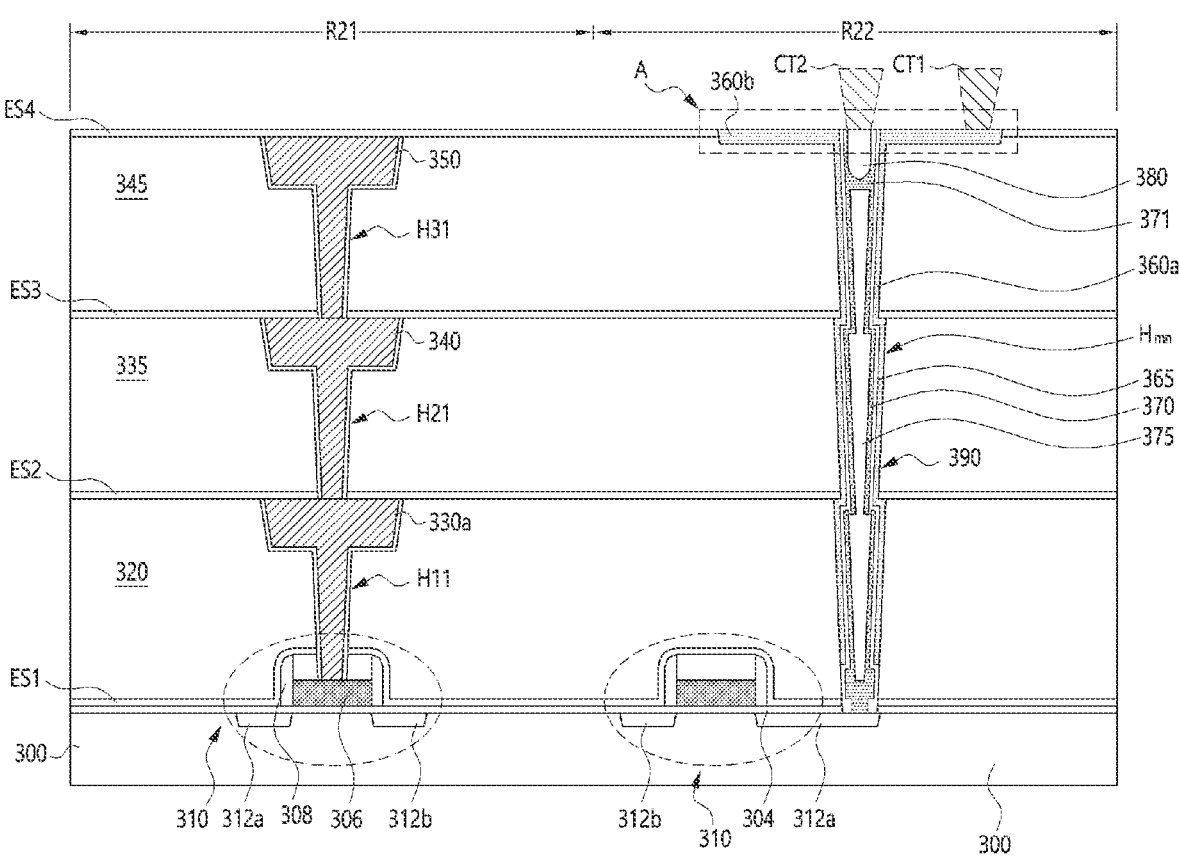

Referring to FIG. 9, a gap-filling insulation layer 375 may be formed in the multi-level contact hole Hm to fully fill up the multi-level contact hole Hm with the gap-filling insulation layer 375. For example, the gap-filling insulation layer 375 may include perhydropolysilazane-based inorganic spin-on dielectric (PSZ-SOD). The gap-filling insulation layer 375 in the multi-level contact hole Hm may be recessed to define a drain formation region in the multi-level contact hole Hm where a drain may be formed. In some embodiments, a recessed thickness of the gap-filling insulation layer 375 may be determined in accordance with characteristics of the vertical transistor in the multi-level contact hole Hm. The drain formation region may be filled with a semiconductor layer 371. The semiconductor layer 371 may include a material substantially the same as the material of the vertical channel layer 370. Impurities having a high concentration, which may have a conductive type substantially the same as the conductive type of the source 312a, may be implanted into the semiconductor layer 371 to form a drain 380 in the semiconductor layer 370. Thus, a transistor 390 having the vertical channel may be integrated in the multi-level contact hole Hm.

Conductive contacts CT1 and CT2 may be connected with the gate pad 360b and the drain 380. Voltages may be applied to the gate and the drain of the transistor 390 through the conductive contacts CT1 and CT2.

Figure 10:
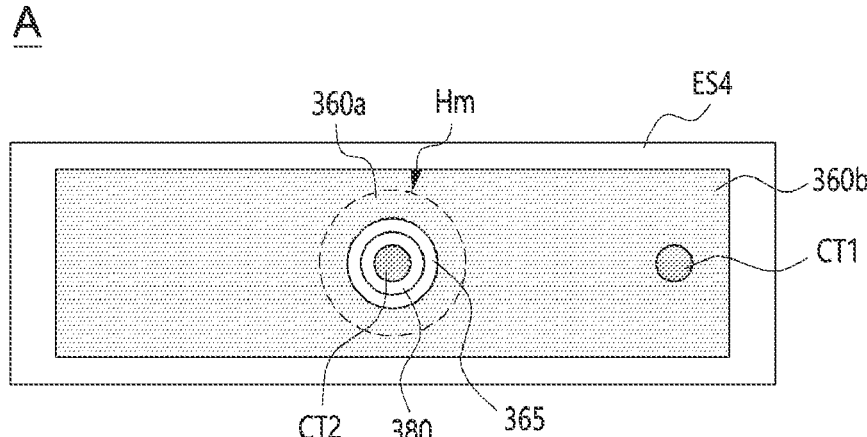
FIG. 10 is a plan view of a portion "A" in FIG. 9.

FIG. 10 is a plan view of a portion "A" in FIG. 9.

Referring to FIG. 10, the vertical gate 360a, the gate insulation layer 365 and the drain having a cylindrical shape may be sequentially formed on the sidewall of the multi-level contact hole ism. The gate pad 360b may be horizontally extended from the vertical to gate 360a. Thus, a contact area between the gate pad 360b and the conductive contact CT1 may be secured to readily transmit the electrical signal to the vertical gate 360a having the liner shape. The drain 380 may be surrounded by the gate insulation layer 365 so that the drain may be electrically isolated from the vertical gate 360a and is the gate pad 360b.

In some embodiments, the semiconductor integrated circuit device may include the pair of the transistors, not limited thereto.

Figure 11:
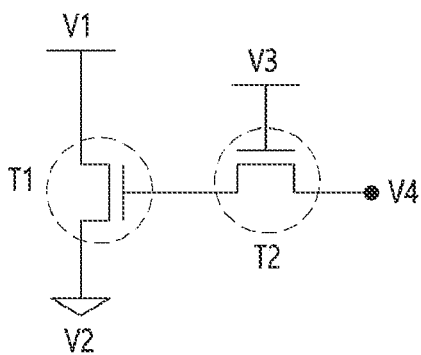
FIG. 11 is a circuit diagram illustrating a semiconductor integrated circuit device in accordance with examples of embodiments.
Figure 12:
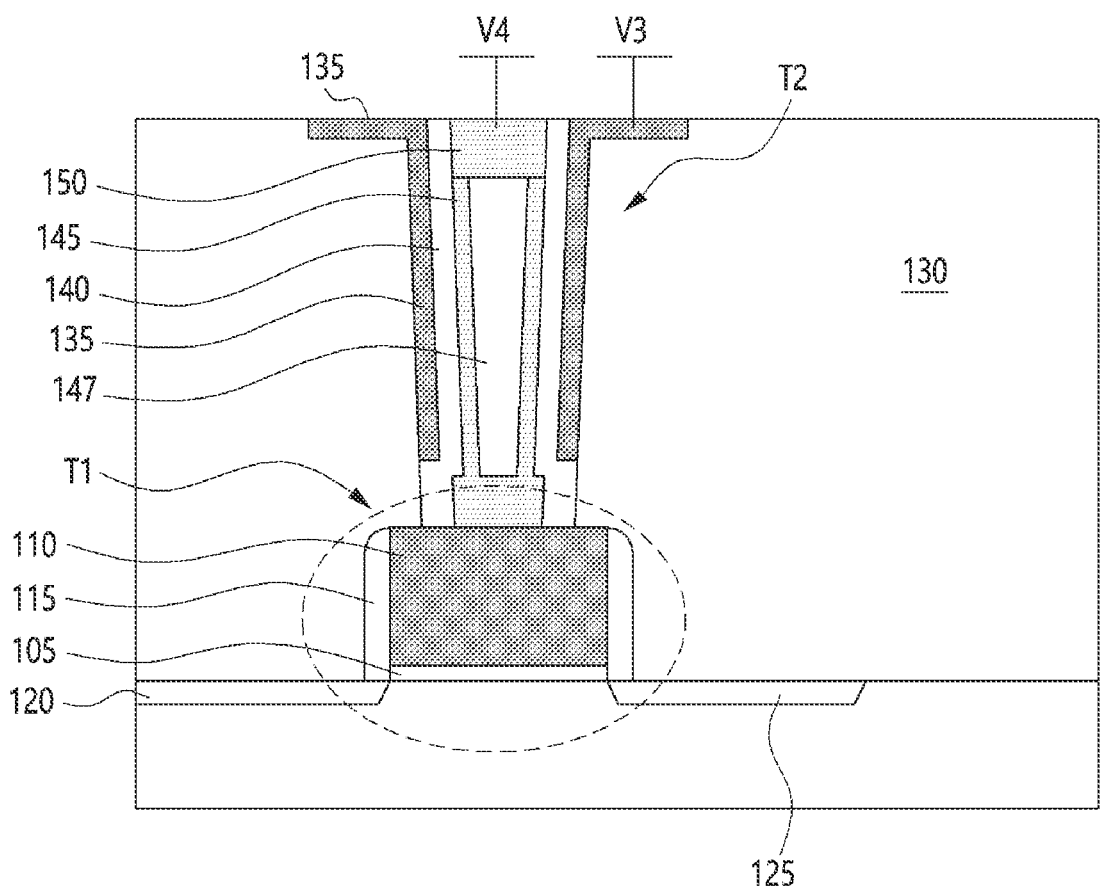
FIG. 12 is a cross-sectional view illustrating the semi- conductor integrated circuit device in FIG. 11.

FIG. 11 is a circuit diagram illustrating a semiconductor integrated circuit device in accordance with various embodiments and FIG. 12 is a cross-sectional view illustrating the semiconductor integrated circuit device in FIG. 11. In FIGS. 11 and 12, the same reference numerals may refer to the same elements and any further illustrations with respect to the same elements may be omitted herein for brevity.

Referring to FIGS. 11 and 12, a semiconductor integrated circuit device 10a may include a first transistor T1 and a second transistor T2. A gate 110 of the first transistor T1 may be electrically connected to a drain or a source of the second transistor T2. A drain of the first transistor T1 may be electrically connected to a first voltage terminal V1. A source of the first transistor T1 may be electrically connected to a second voltage terminal V2. The first transistor T1 may be an element in the peripheral circuit. For example, the first transistor T1 may include a transistor having a horizontal channel.

Although not depicted in FIG. 12, the first voltage terminal V1 and the second voltage terminal V2 may be electrically connected with the drain 120 and the source 125 of the first transistor T1 via a multi metal wiring.

The drain or the source of the second transistor T2 may be electrically connected to the gate 110 of the first transistor T1, The gate 135 of the second transistor T2 may be electrically connected to a third voltage terminal V3. The source or the drain of the second transistor T2 may be electrically connected to a fourth voltage terminal V4. The drain or the source of the second transistor T2 may correspond to the gate 110 of the first transistor T1. The second transistor T2 of some embodiments may include the transistor having the vertical channel in FIG. 1 or FIG. 9. A reference numeral 147 may indicate a gap-filling insulation layer in a contact hole.

Figure 13:
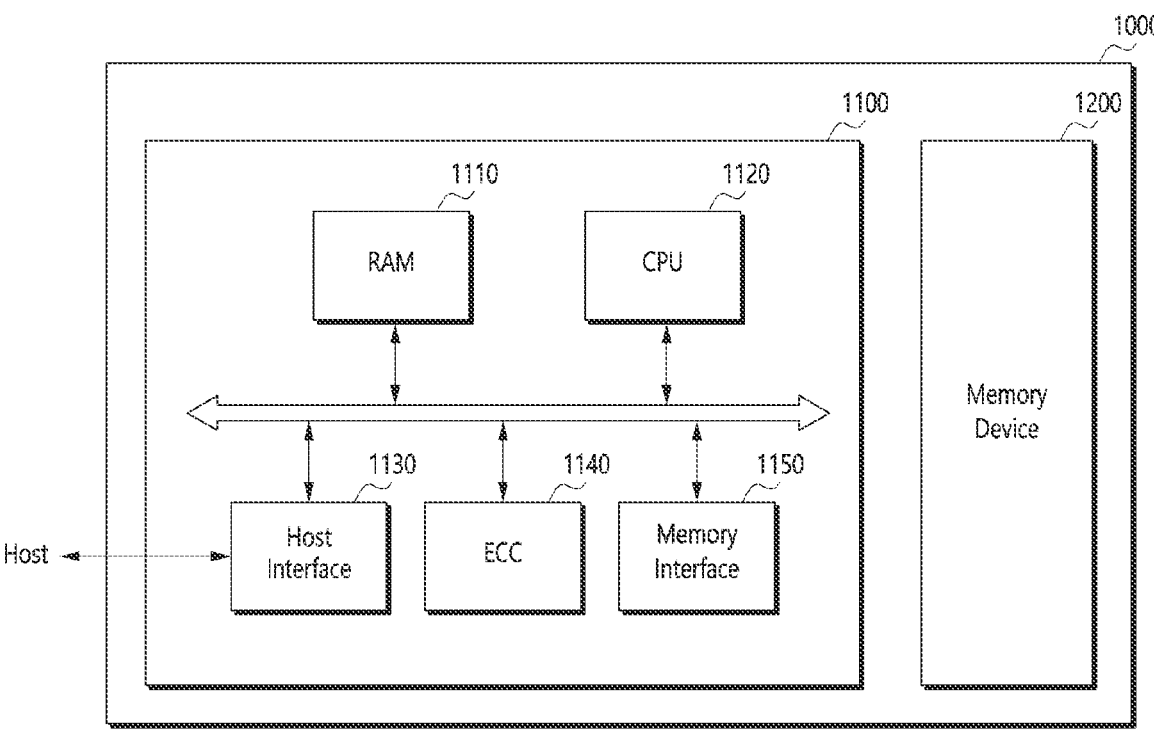
FIG. 13 is a block diagram illustrating a memory system in accordance with examples of embodiments.

FIG. 13 is a block diagram illustrating a memory system in accordance with various embodiments.

As illustrated in FIG. 13, the memory system 1000 may include a memory device 1200 and a controller 1100.

The memory device 1200 may be used to store various data types such as text, graphic and software code. The memory device 1200 may be a non-volatile memory with a PUC (peri under cell) structure or a volatile memory with a PUC structure. The memory device 1200 may have the memory cell including at least one planar type transistor and at least one vertical type transistor which is electrically connected to electrodes of the planar type transistor and is formed in the contact hole as shown in FIG. 1 to FIG. 12.

The controller 1100 may be couple to a host and the memory device 1200, and may access the memory device 1200 in is response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may be interface with the host. For example, the controller 1100 may communicate with the host through one of various interface protocols including a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data.

The buffer memory may temporarily store data, externally transferred through the host interface 1130, or temporarily store data, transferred from the memory device 1200 through the memory interface 1150. In addition, the controller 1100 may further include ROM storing code data to interface with the host.

Figure 14:
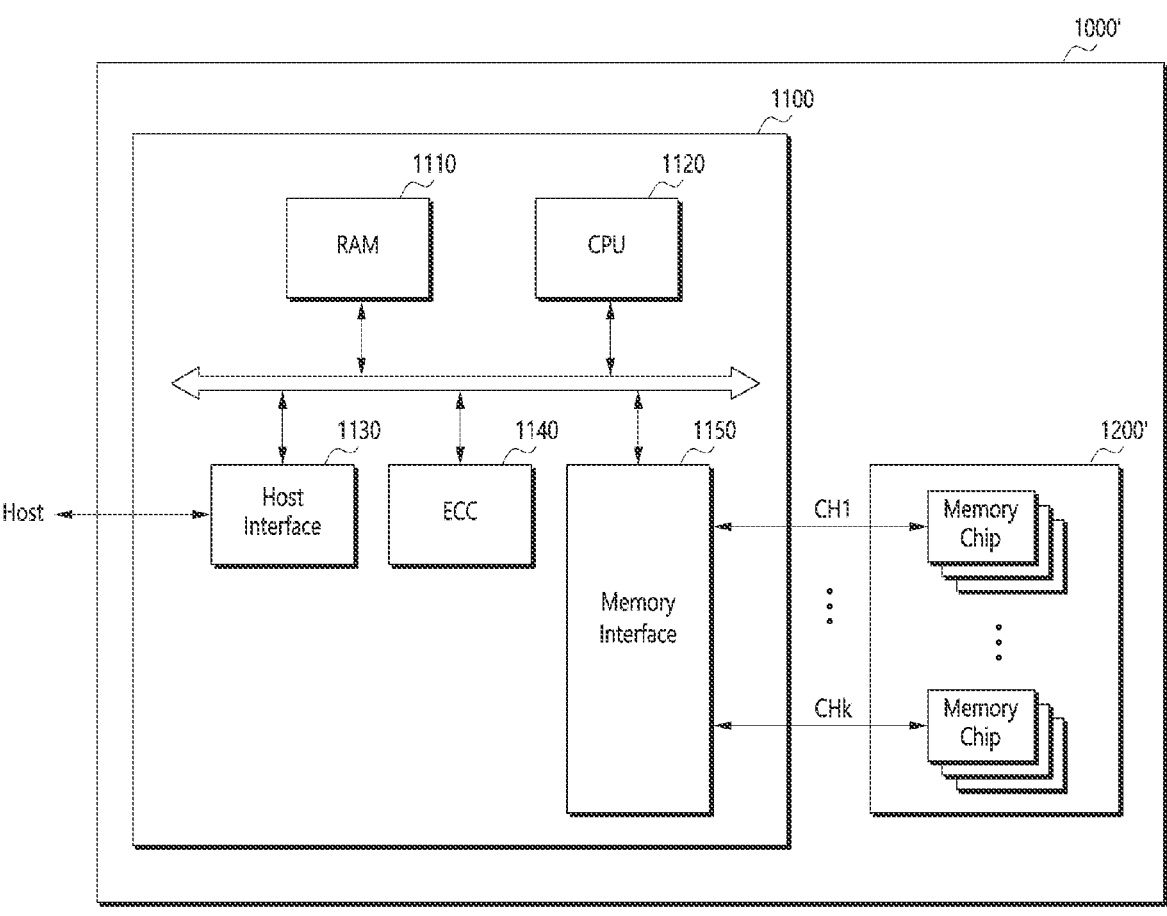
FIG. 14 is a block diagram illustrating a memory system in accordance with examples of embodiments.

FIG. 14 a block diagram illustrating a memory system in accordance with various embodiments.

Referring to FIG. 14, the memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory with a PUC (peri under cell) structure or a volatile memory with a PUC structure. The memory device 1200 may have the memory cell including at least one planar type transistor and at least one vertical type transistor which is electrically connected to electrodes of the planar type transistor and is formed in the contact hole as shown in FIG. 1 to FIG. 12.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, the memory system 1000' includes the memory cells including at least one planar type transistor and at least one vertical type transistor which is electrically connected to electrodes of the planar type transistor and is formed in the contact hole as shown in FIG. 1 to FIG. 12. Thus, an integrated density of the memory system are also improved.

Figure 15:
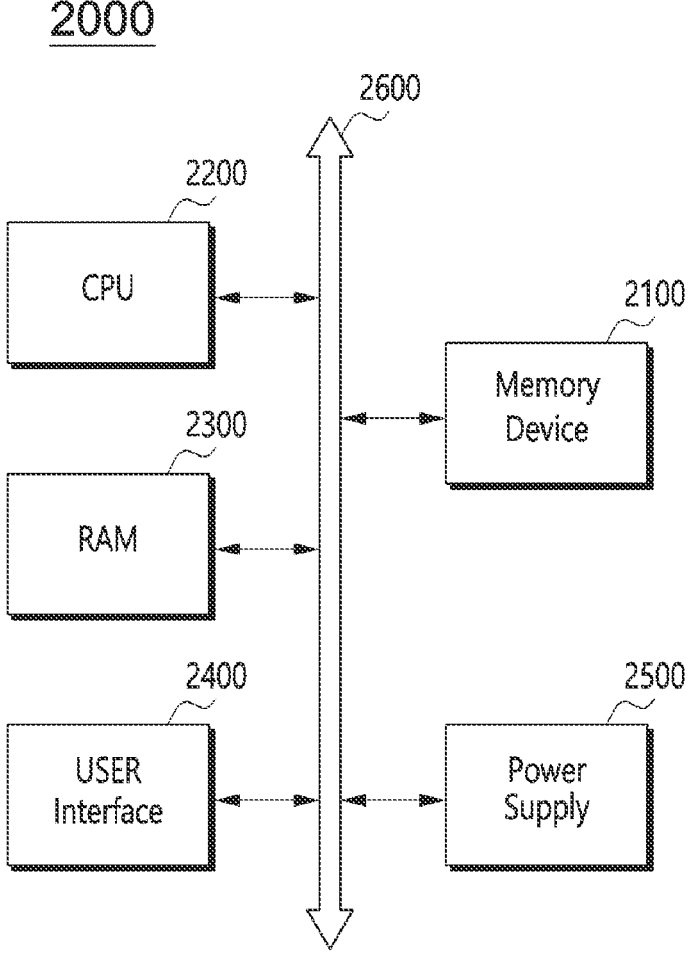
FIG. 15 is a block diagram illustrating a computing system in accordance with examples of embodiments.

FIG. 15 is a block diagram illustrating a computing system in accordance with examples of embodiments.

As illustrated in FIG. 15, the computing system 2000 may include a memory device 2100, a CPU 2200, a random-access memory (RAM) 2300, a user interface 2400, a power supply 2500, and a system bus 2600.

The memory device 2100 may store data, which is input through the user interface 2400, and data, which is processed by the CPU 2200, In addition, the memory device 2100 may be electrically coupled to the CPU 2200, the RAM 2300, the user interface 2400, and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory with a PUC (peri under cell) structure or a volatile memory with a PUC structure. The memory device 1200 may have the memory cell including at least one planar type transistor and at least one vertical type transistor which is electrically connected to electrodes of the planar type transistor and is formed in the contact hole as shown in FIG. 1 to FIG. 12.

In addition, as described above with reference to FIG. 14, the memory device 2100 may be a mufti-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

Figure 16:
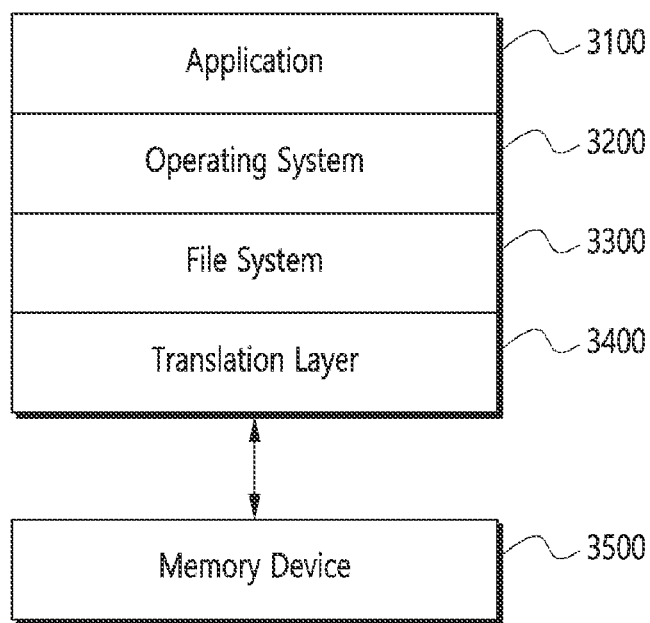
FIG. 16 is a block diagram illustrating a computing system in accordance with examples of embodiments.

FIG. 16 is a block diagram illustrating a computing system in accordance with various embodiments.

As illustrated in FIG. 16, the computing system 3000 may include a software layer that has an operating system 3200 an application 3100, a file system 3300, and a translation layer 3400, In addition, the computing system 3000 may include a hardware layer such as a memory device 3500, In some embodiments, the computing system 3000 may include a hardware layer such as a memory system.

The operating system 3200 manages software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS), In addition, when the operating system 3200 is a Unix/Linux-based system, the file system 3300 may be an extended file system (EXT), a Unix file system (UFS), or a journaling file system (JFS).

FIG. 16 illustrates the operating system 3200, the application 3100, and the file system 3300 in separate blocks. However, the application 3100 and the file system 3300 may be included in the operating system 3200.

The translation layer 3400 may translate an address to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory with a PUC (peri under cell) structure or a volatile memory with a PUC structure. The memory device 3500 may have the memory cell including at least one planar type transistor and at least one vertical type transistor which is electrically connected to electrodes of the planar type transistor and is formed in the contact hole as shown in FIG. 1. to FIG. 12.

The computing system 3000 having the above-described configuration may be divided into an operating system layer that is operated in an upper layer region and a controller layer that is operated in a lower layer region. The operating system 3200, the application 3100, and the file system 3300 may be included in the operating system layer and driven by an operation memory. In addition, the translation layer 3400 may be included in the operating system layer or the controller layer.

The above described embodiments of the present teachings are intended to illustrate and not to limit the present disclosure. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A semiconductor integrated circuit device comprising:
a semiconductor substrate;
a first transistor over the semiconductor substrate, the first transistor including a horizontal channel substantially parallel to a surface of the semiconductor substrate;
an insulating interlayer over the semiconductor substrate, the insulating interlayer including a contact hole through the insulating interlayer; and
a second transistor including a channel layer in the contact hole,
wherein any one of a source and a drain included in the second transistor is electrically connected to at least one electrode of the first transistor.

2. The semiconductor integrated circuit device of claim 1, wherein the second transistor comprises:
a vertical gate over a sidewall of the contact hole;
a gate insulation layer over a surface of the vertical gate and the sidewall of the contact hole;
a vertical channel layer over a surface of the gate insulation layer and a bottom surface of the contact hole; and
a first junction region in an upper region of the vertical channel layer,
wherein at least a part of the vertical channel layer on the bottom surface of the contact hole is electrically connected to the at least one electrode of the first transistor to form a second junction region.

3. The semiconductor integrated circuit device of claim 2, wherein the second transistor further comprises a gate pad extended from the vertical gate along an upper surface of the insulating interlayer.

4. The semiconductor integrated circuit device of claim 2, wherein the second transistor further comprises a gap-filling insulation layer in a space surrounded by the vertical channel layer and the first junction region is arranged over the vertical channel layer and the gap-filling insulation layer.

5. The semiconductor integrated circuit device of claim 1, wherein the insulating interlayer comprises:
a first insulating interlayer including the first transistor and a wiring connection configured to transmit an electrical signal to the first transistor;
a second insulating interlayer over the first insulating interlayer, the second insulating interlayer including a first stack structure with a plurality of memory cells; and
a third insulating interlayer over the second insulating interlayer, the third insulating interlayer including a second stack structure with a plurality of memory cells electrically connected with the first stack structure.

6. The semiconductor integrated circuit device of claim 5, wherein the contact hole is configured to pass through the first to third insulating interlayers to expose the at least one electrode of the first transistor.

7. The semiconductor integrated circuit device of claim 5, wherein the first insulating interlayer further comprises peripheral circuits configured to control the plurality of memory cells of the first and second stack structures.

8. The semiconductor integrated circuit device of claim 1, wherein a conductive plug is interposed between the at least one electrode of the first transistor and a source or a drain of the second transistor electrically connected to the at least one electrode of the first transistor.

9. A semiconductor integrated circuit device comprising:
a first deck including peripheral circuits integrated in a semiconductor substrate and a first insulation layer configured to electrically isolate the peripheral circuits from each other;
a second deck arranged on the first deck, the second deck including memory cell arrays and a second insulation layer, each of the memory cell arrays including a plurality of memory cells controlled by the peripheral circuits, and the second insulation layer configured to electrically isolate the memory cell arrays from each other;
an electric element provided to the first deck, the electric element corresponding to a part of the peripheral circuit; and
a transistor including a channel layer formed in a contact hole passing through the first and second insulation layers to expose the electric element.

10. The semiconductor integrated circuit device of claim 9, wherein the transistor including the channel layer comprises:
a vertical gate over a sidewall of the contact hole, the vertical gate spaced apart from the electric element exposed through the contact hole;
a gate insulation layer over a surface of the vertical gate and the sidewall of the contact hole;
a vertical channel layer over a surface of the gate insulation layer and a bottom surface of the contact hole;
a gap-filling insulation layer configured to fill a space surrounded by the vertical channel layer; and
a first junction region over the vertical channel layer and the gap-filling insulation layer,
wherein a second junction region configured to generate a channel together with the first junction region comprises a part of the vertical channel layer on a bottom surface of the contact hole facing the first junction region.

11. The semiconductor integrated circuit device of claim 10, wherein the transistor including the channel layer further comprises a gate pad extended from the vertical gate along an upper surface of the second deck.

12. The semiconductor integrated circuit device of claim 10, wherein a conductive plug is interposed between the electric element and the vertical channel layer on the bottom surface of the contact hole.

13. The semiconductor integrated circuit device of claim 10, wherein at least one additional deck is interposed between the first deck and the second deck, the additional deck comprises an insulation layer configured to electrically isolate memory cell arrays from each other, and the contact hole is formed through the insulation layer of the additional deck.

14. The semiconductor integrated circuit device of claim 9, wherein the electric element comprises any one of a gate, a source and a drain of a transistor in the peripheral circuit, or any one of wirings electrically connected to the gate, the source and the drain of the transistor in the peripheral circuits.

15. The semiconductor integrated circuit device of claim 9, wherein the memory cell array comprises:
a stack structure including a plurality of insulation layers and a plurality of cell gates alternately stacked; and
a plurality of channel structures through the stack structure.

16. A method of manufacturing a semiconductor integrated circuit device, the method comprising:

forming an electric element on a semiconductor substrate;

forming an insulating interlayer on the semiconductor substrate with the electric element;

etching the insulating interlayer to form a first contact hole configured to expose the electric element; and forming a transistor having a vertical channel in the first contact hole, wherein forming the transistor having the vertical channel comprises:

forming a vertical gate on a sidewall of the first contact hole;

forming a gate insulating layer on a surface of the vertical gate and the sidewall of the contact hole;

forming a vertical channel layer on a surface of the gate insulation layer and the electric element exposed through the first contact hole; and forming a junction region in an upper region of the vertical channel layer.

17. The method of claim 16, wherein forming the electric element comprises at least one of forming a gate on the semiconductor substrate, implanting impurities into the semiconductor substrate at both sides of the gate to form a source and a drain and forming a wiring connection connected to the gate, the source and the drain, wherein the electric element is at least one of the gate, the source, the drain and the wiring connection.

18. The method of claim 16, further comprising at least once repeatedly forming a stack type memory cell array on the semiconductor substrate with the electric element, wherein the insulating interlayer has a thickness greater than a height of the stack type memory cell arrays.

19. The method of claim 16, further comprising:

simultaneously forming a first contact hole and a second contact hole in the insulating interlayer between forming the insulating interlayer and forming the transistor including the vertical channel; and selectively forming a conductive wiring in the second contact hole.

20. The method of claim 16, wherein forming the junction region comprises:

forming a gap-filling insulation layer in a space surrounded by the vertical channel layer in the first contact hole;

recessing the gap-filling insulation layer to define a region where the junction region is to be formed, the gap-filling insulation layer having a height lower than a height of the first contact hole;

forming a semiconductor layer in the region, the semiconductor layer including a material substantially the same as a material of the vertical channel layer; and implanting impurities into the semiconductor layer to form the junction region.

* * * * *